United States Patent [19]
Moore et al.

[11] Patent Number: 5,995,521
[45] Date of Patent: Nov. 30, 1999

[54] EXTERNAL CAVITY LASER PIVOT DESIGN

[75] Inventors: Bruce A. Moore, Santa Clara; David F. Arnone, Mountain View; Robert L. MacDonald, Sunnyvale, all of Calif.; Francis S. Luecke, Crestwood, Ky.

[73] Assignee: New Focus, Inc., Santa Clara, Calif.

[21] Appl. No.: 09/079,057

[22] Filed: May 14, 1998

Related U.S. Application Data

[60] Provisional application No. 60/046,728, May 16, 1997.

[51] Int. Cl.⁶ .................................................. H01S 3/10
[52] U.S. Cl. .............................. 372/20; 372/102; 372/92; 372/96; 372/98; 372/107
[58] Field of Search ................................. 372/92, 102, 20, 372/96, 19, 98, 107

[56] References Cited

U.S. PATENT DOCUMENTS

| | | | |
|---|---|---|---|
| 5,319,668 | 6/1994 | Luecke | 372/107 |
| 5,570,384 | 10/1996 | Nishida et al. | 372/19 |
| 5,579,327 | 11/1996 | Ohtateme et al. | 372/20 |

FOREIGN PATENT DOCUMENTS

| | | | |
|---|---|---|---|
| 0 702 438 A1 | 3/1996 | European Pat. Off. | H01S 3/085 |
| 296 06 494 U1 | 6/1997 | Germany | H01S 3/085 |

OTHER PUBLICATIONS

McNicholl, P. et al., "Synchronous cavity mode and feedback wavelength scanning in dye laser oscillators with gratings", *Applied Optics*, vol. 24, No. 17, Sep. 1985, pp. 2757–2761.

Liu, K. et al., "Novel geometry for single–mode scanning of tunable lasers", *Optics Letters*, vol. 6. No. 3, Mar. 1981, pp. 117–118.

Littman, M. et al., "Spectrally narrow pulsed dye laser without beam expander", *Applied Optics*, vol. 17, No. 14, Jul. 1978, pp. 2224–2227.

Harvey, K. et al., "External–cavity diode laser using a grazing–incidence diffraction grating", *Optics Letters*, vol. 16, No. 12, Jun. 1991, pp. 910–912.

Maki, J. et al., "Stabilized diode–laser system with grating feedback and frequency–offset locking", *Optics Communications*, vol. 102, No. 3/4, Oct. 1993, pp. 251–256.

*Primary Examiner*—Leon Scott, Jr.
*Attorney, Agent, or Firm*—Wilson Sonsini Goodrich & Rosati

[57] ABSTRACT

Disclosed are both a housing and an assembly for a tunable external cavity laser. The housing includes: a base section, a motion section, and an actuator. The base section includes a proximal and distal portion, and the laser and the dispersive element mounted at respectively the proximal and distal portions such that energy emanating from the laser strikes the dispersive element leaving the dispersive element as a second beam at an angle with respect to the first beam which depends on wavelength. The motion section includes a proximal and a distal portion and a torsional member positioned at the proximal portion and the reflector positioned at the distal portion to reflect the second beam to the laser via the dispersive element, and the motion section supported by the base about the torsional member. The actuator is in selectively engagable abutment against the distal portion of the motion section to move the reflector with respect to the dispersive element about the torsional member to tune the external cavity laser.

44 Claims, 12 Drawing Sheets

EXTERNAL CAVITY LASER PIVOT DESIGN

CROSS REFERENCE TO RELATED APPLICATION

This application claims the benefit of prior filed copending Provisional Application No. 60/046,728, filed on May 16, 1997, entitled ECDL Pivot Designs.

BACKGROUND OF THE INVENTION

1. Field of the Invention

The invention relates to tunable external cavity lasers and more particularly, to methods and apparatus for tuning external cavity lasers.

2. Description of Related Art

The basic principles of the operation of the tunable laser utilizing a variable length external cavity in conjunction with a diffraction grating and a rotatable mirror are set forth in the publication, "Spectrally Narrow Pulse Dye Laser Without Beam Expander," by Michael G. Littman and Harold J. Metcalf, Applied Optics, vol. 17, No. 14, pages 2224–2227, Jul. 15, 1978. Although the article describes a system which uses a dye laser, the diode laser is easily substituted. The system utilizes a diffraction grating which is filled with an incident collimated laser beam by using the grating at a grazing angle. The diffracted beam at the angle normal to the mirror is reflected back onto the grating and from there it is diffracted in a direction opposite the original collimated beam. The first order of diffraction of the grating is incident on the mirror, which reflects it back onto the grating, where the first order of diffraction passes back into the gain medium, where it serves to determine the operating wavelength of the laser. The output of the system is the zero-order reflection from the grating at grazing incidence. Motion of the mirror with respect to the grating allows the system to be tuned to a desired output wavelength.

The above mentioned design is susceptible to discontinuities in the output spectrum. These discontinuities are caused by mode hopping which is a change in the integral number of wavelengths in the cavity over the tuning range. To overcome mode hopping U.S. Pat. No. 5,319,668 teaches a pivot point for the reflective element, e.g. mirror or dihedral reflector, which provides for simultaneous rotary and linear motion with respect to the grating and thus theoretically overcomes the problem of mode hopping. The pivot point is selected so as to provide an internal cavity length which is exactly an integral number of half wavelengths at three different wavelengths and an exceptionally close (within $1/1000$ of one wavelength) match at all other wavelengths within the tuning range. The pivot point calculation takes into account the effect of the dispersion of the gain medium and other optical elements in the system on the cavity length.

While this arrangement represents a significant improvement compared to previous external cavity diode lasers by providing a pivot capable of tuning over a wide range of wavelengths, it still has a number of drawbacks. Chief among these is the expense of the precision bearings needed for pivoting the reflective element about the pivot point. The bearings are extremely expensive because they need to be stable on a nanometer scale over their range of motion. The fineness of machining needed to accomplish these extreme tolerances makes the price of the bearings extremely high.

What is needed is a design for tuning external cavity semiconductor diode lasers (ECDL) which does not require the expense and precision of prior art bearing designs and is not susceptible to mode hopping. What is needed is a design that allows for a pivot point for the reflector which provides for both rotary and lineal translation of the reflector with respect to the grating, without expensive bearings. What is needed is a pivot design that will maintaining a constant number of half-wavelengths within the cavity across the entire tuning range without the precision of prior art designs. What is needed is a design that provides for a broad tunable range of output wavelengths.

SUMMARY OF THE INVENTION

An inexpensive external cavity diode laser (ECDL) is disclosed. The ECDL has a broad range of selectable center frequencies and a narrow tuning range about each center frequency. The pivot point of the designs is inexpensive and precise and allows for simultaneous rotary and lineal motion.

In an embodiment of the invention a housing for a tunable external cavity laser including a gain medium, a reflector, and a dispersive element is disclosed. The housing includes: a base section, a motion section, and an actuator. The base section includes a proximal and distal portion, and the gain medium and the diffractor mounted at respectively the proximal and distal portions such that a first energy beam emanating from the gain medium strikes the dispersive element leaving the dispersive element as a second beam at an angle with respect to the first beam which depends on wavelength. The motion section includes a proximal and a distal portion and a torsional member positioned at the proximal portion and the reflector positioned at the distal portion to reflect the second beam to the gain medium via the dispersive element, and the motion section supported by the base about the torsional member. The actuator is in selectively engagable abutment against the distal portion of the motion section to move the reflector with respect to the dispersive element about the torsional member to tune the external cavity laser.

In an alternate embodiment of the invention a tunable external cavity laser assembly is disclosed. The tunable external cavity laser assembly includes: a gain medium, a dispersive element, a reflector, a base section, a motion section, and an actuator. The base section includes a proximal and distal portion, and the gain medium and the dispersive element mounted at respectively the proximal and distal portions such that a first energy beam emanating from the gain medium strikes the dispersive element leaving the dispersive element as a second beam at an angle with respect to the first beam which depends on wavelength. The motion section includes a proximal and a distal portion and a torsional member positioned at the proximal portion and the reflector positioned at the distal portion to reflect the second beam to the gain medium via the dispersive element, and the motion section supported by the base about the torsional member. The actuator is in selectively engagable abutment against the distal portion of the motion section to move the reflector with respect to the dispersive element about the torsional member to tune the external cavity laser.

DETAILED DESCRIPTION OF THE INVENTION

Figure 1:
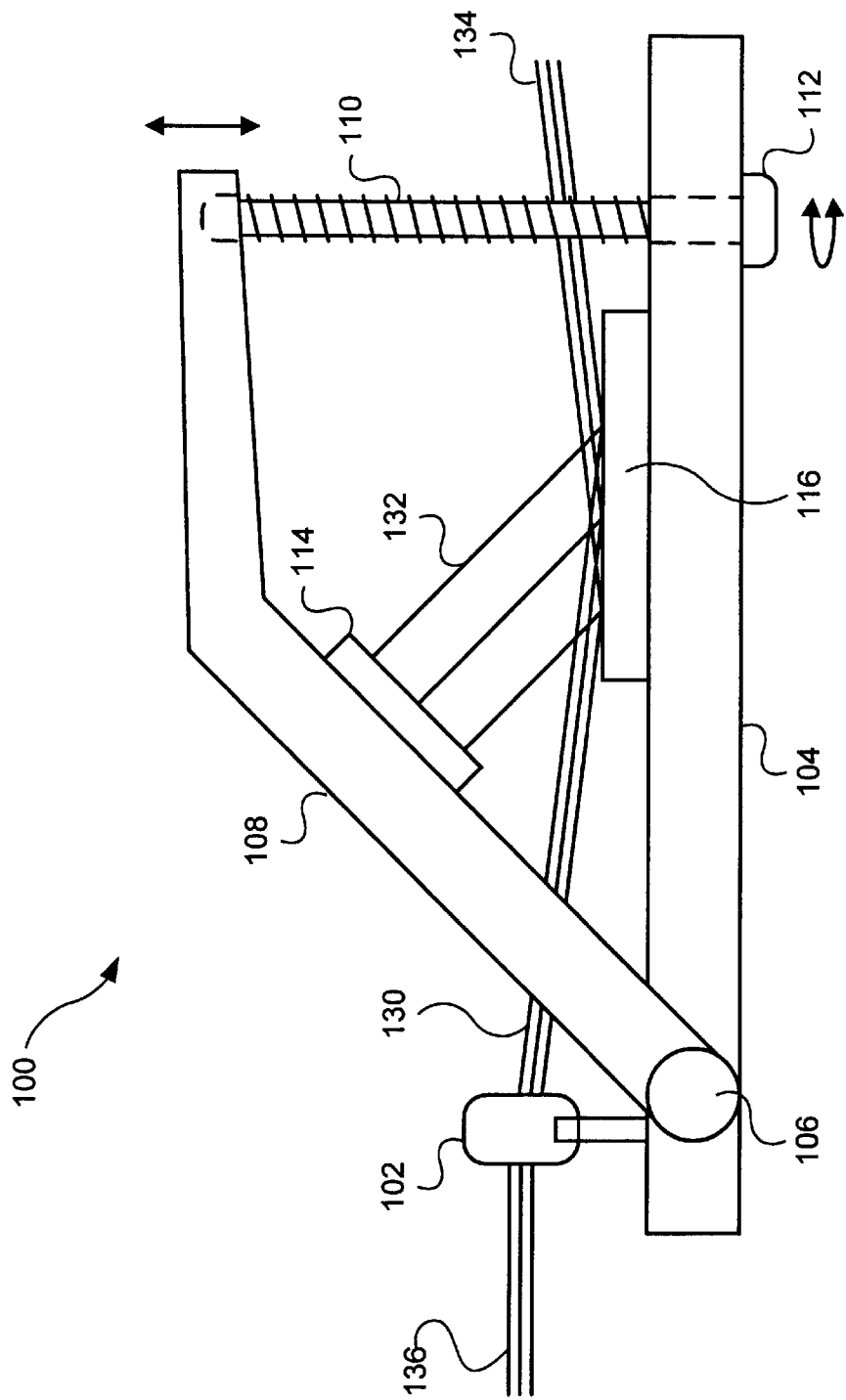
FIG. 1 shows a side elevation view of a prior art tunable external cavity laser.

Prior art tunable external cavity lasers rely upon an expensive bearing to permit tuning of the laser over a broad range of wavelengths. The expense of this bearing results from the requirement that the bearing meet nanometer tolerances over its range of motion. An example of such a prior art laser 100 is seen in FIG. 1. External cavity laser 100 includes: a gain medium, e.g. laser 102, base 104, pivot 106, motion section 108, positioning screw 110, positioning screw knob 112, a reflector, e.g. mirror 114, and a dispersive element, e.g. diffraction grating 116.

Motion section 108 is supported on base 104 via pivot 106 at a proximal end of the motion section. A distal end of the motion section is positioned with respect to the base via positioning screw 110 and positioning screw knob 112. Mirror 114 is mounted on the motion section such that it faces the diffraction grating 116 which is mounted on an upper surface of the base. Laser 102 is also mounted on the base such that the beam 130 it emits strikes the diffraction grating at a grazing angle causing a reflection beam 134 and a first order diffraction beam 132. The angle of the first order diffraction beam 132 with respect to the laser beam 130 varies as a function of wavelength. The first order diffraction is incident on the mirror 114. The first order diffraction is reflected by the mirror back to the laser via the diffraction grating to select a wavelength of the zero-order reflection.

In operation motion section 108 pivots about pivot 106 under the control of the positioning screw 110. Pivot 106 is finely machined to nanometer tolerance to ensure smooth movement over the range of its motion. The precise position of the motion section is adjusted by clockwise and counter-clockwise rotation of the positioning screw knob 112 which moves the distal end of the motion section toward and away from the base. As the motion section is moved about the pivot point, mirror 114 moves in relation to diffraction grating 116. Laser beam 130 enters an external cavity formed by the laser at one end, the grating in the middle, and the mirror at the opposite end. Energy from the laser 102, strikes the diffraction grating and is refracted into the mirror, as is shown by beam 132, which represents the first order diffraction. A portion of laser beam 130 is reflected as the zero-order reflection beam 134 which exits the external cavity. The wavelength of reflection beam 134 exiting the external cavity may be adjusted by positioning the mirror mounted on the motion section to increase and decrease the length of the external cavity. As will be obvious to those skilled in the art acceptable outputs of the ECDL may include the zero-order reflection beam 134 and/or a beam 136 emanating from a partially reflective back facet of the laser 102.

Figure 2:
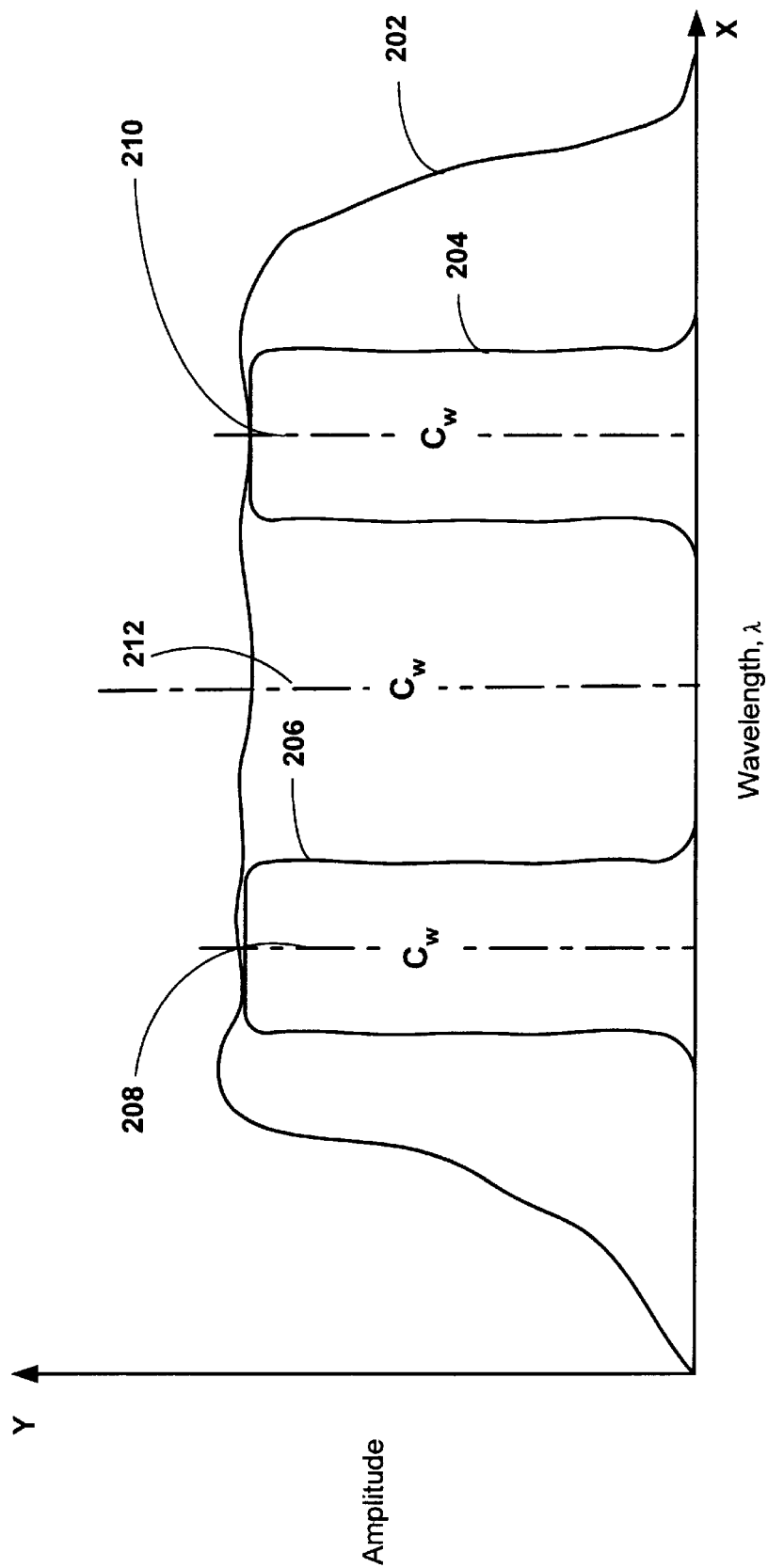
FIG. 2 shows waveforms representing the wavelength tuning range associated with both tunable external cavity lasers of the prior art and the current invention.

FIG. 2 shows a comparison of the wavelength tuning range of a prior art tunable external cavity laser as compared to an external cavity laser according to the invention. FIG. 2 contains a graph in which wavelength is plotted along the X axis, and amplitude is plotted along the Y axis. Waveform 202 represents a waveform characteristic of prior art tunable external cavity lasers. The center wavelength CW 212 is fixed. The waveform is roughly constant in amplitude over a broad range of wavelengths, due to the precise dimensioning of the pivot of prior art ECDLs and the expense associated therewith. Seldom is such broad-band tunability required by any one user.

The current invention instead adopts the approach of providing an inexpensive design with narrow-band tunability and an ability to select a center wavelength. In contrast to the prior art designs which have a fixed center wavelength $C_w$, the current design implements various mechanical features for shifting $C_w$ to suit the needs of individual customers. Waveforms 204–206 and their respective $C_w$ 210–208 represent waveforms characteristic of external cavity lasers according to the current invention. Waveforms 204 and 206 are considerably narrower in bandwidth than is waveform 202. $C_w$ 208 has a shorter wavelength than $C_w$ 212. $C_w$ 210 has a longer wavelength than $C_w$ 212. The $C_w$ of the current invention can be placed anywhere in relation to the $C_w$ 212 of the prior art.

The difference in waveforms between the prior art (e.g. 202) and the waveforms, e.g. waveforms 204–206 produced by the laser disclosed herein, shows the tradeoff between the two designs. The prior art, using fine tolerance and extremely costly bearings, can achieve a broad range of wavelengths with relatively little resetting of the apparatus. By comparison, the inventive laser, using a novel but inexpensive design, operates over a wide range of center wavelengths but cannot be varied as much from the center wavelengths without resetting of the apparatus.

Figure 3:
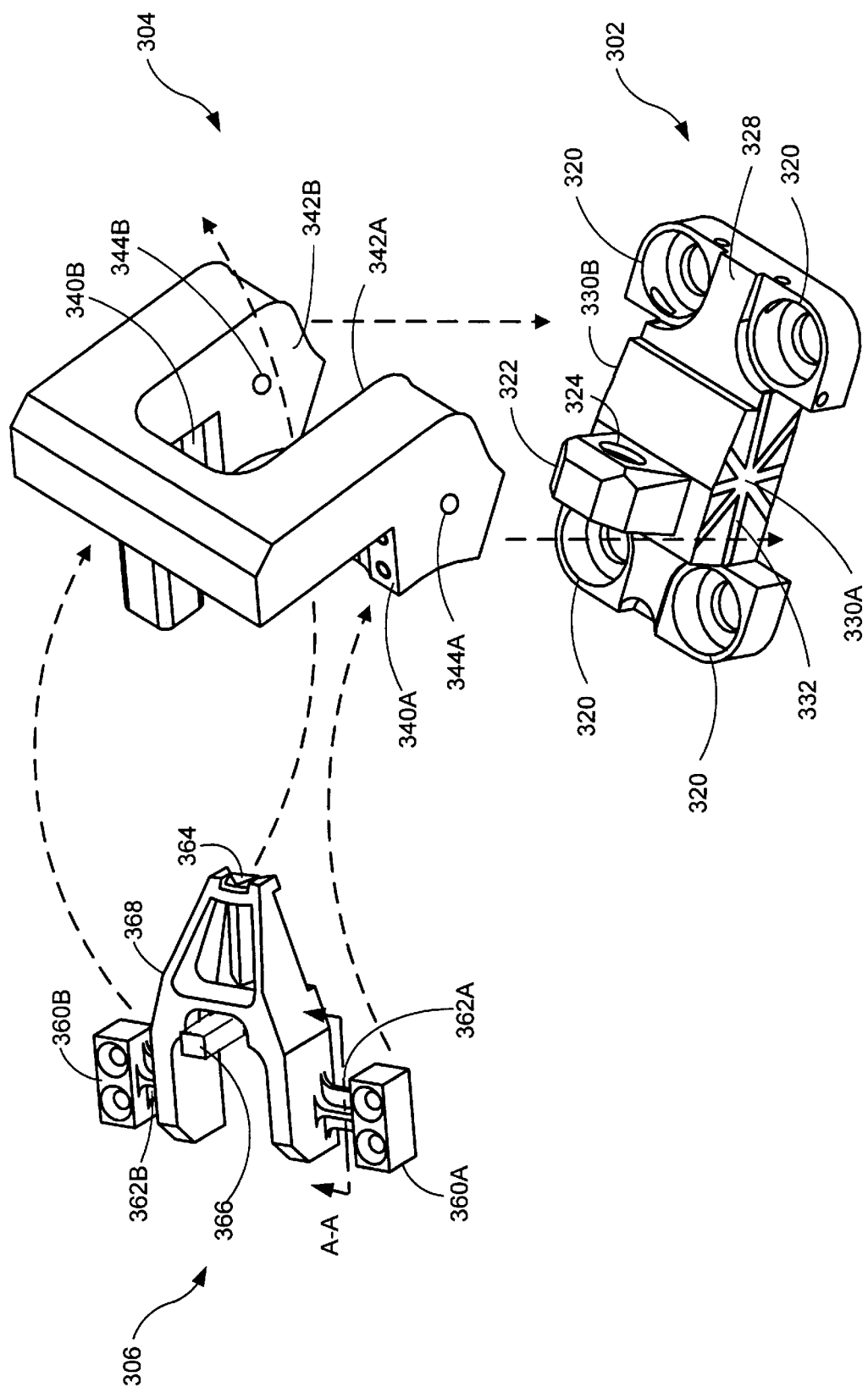
FIG. 3 shows an exploded isometric view of a three-piece housing for a tunable external cavity laser according to the invention.

FIG. 3 shows an exploded isometric view of a three-piece embodiment of a tunable external cavity diode laser housing according to the invention. Shown are base section 302, a positioning member 304, and a motion section 306. Included in base section 302 are mounting holes 320, a gain medium mount 322, a diffraction grating mounting surface 328 and a first pair of base planar surfaces 330A–B. Glue distribution channels 332 are defined in the base mounting surfaces. Included in the positioning member 304 are motion section fastening surfaces 340A–B, set screw holes 344A–B, and a second pair of opposing planar surfaces 342A–B. Included in motion section 306 are anchoring members 360A–B, torsional members 362A–B and a distal portion 368.

Mounting holes 320 are located in the base section 302, and penetrate the base section. Gain medium mount 322 contains gain medium, e.g. laser 324 and is located on the upper surface of the base section. The opposing first pair of base planar surfaces 330A–B are located on either long side of the base section, and face outward. Glue distribution channels 332 are defined in each of the first pair of base planar surfaces. The second pair of opposing planar surfaces 342A–B of the positioning member 304, face inwardly, and are dimensioned to slidably fit together with the first pair of base planar surfaces. Set screw holes 344A–B are defined in the positioning member and protrude through each of the second pair of opposing planar surfaces to interface with the first pair of base planar surfaces and to lock the positioning member with respect to the base.

The slidable positioning of the first pair of base planar surfaces 330A–B and the second pair of opposing planar surfaces 342A–B of the positioning member allows a center wavelength for the ECDL to be selected. The same device can be assembled in a multiplicity of center wavelengths by altering the position of the first pair of planar surfaces with respect to the second pair of planar surfaces. This is different from the prior art, which relies on a previously fixed pivot, instead of a slidably cooperative pivot, to achieve the desired positioning.

A gain medium, e.g. laser 324, is shown positioned in gain medium mount 322. A reflector, e.g. dihedral reflector 364, and an actuator 366 are shown attached to the distal end of the motion section 306. A dispersive element, e.g. a diffraction grating, may be attached to diffraction grating mounting surface 328. As will be obvious to those skilled in the art the gain medium may be implemented in a variety of devices including but not limited to: a semiconductor diode chip, a junction laser, a vertical cavity laser, a rare earth doped fiber, or a rare earth doped glass. As will be obvious to those skilled in the art the actuator may be implemented as any number of electrical, mechanical or electromechanical devices including but not limited to: a piezoelectric actuator, an electrostrictive actuator, a magnetostrictive actuator, a screw, a micrometer, a solenoid, a bimetalic strip, and a thermal expansion member. As will be obvious to those skilled in the art the dihedral reflector may be replaced with many different reflectors including but not limited to: a dihedral reflector, a cat's eye reflector, a hollow dihedral reflector and a mirror. As will be obvious to those skilled in the art the dispersive element may be implemented with a variety of elements including but not limited to: a diffraction grating, a prism, Fen acousto-optic crystal. Motion section fastening surfaces 340A–B are located on an intermediate portion of positioning member 304. Torsional members 362A–B are attached to a proximal end of the motion section 306. The torsional portions join the proximal end of the motion section to the anchoring members 360A–B.

In operation, the base section 302 is mounted to a surface using screws passing through mounting holes 320. Motion section 306 is mounted on the positioning member 304 by fastening the motion section anchoring members 360A–B to the motion section fastening surfaces 340A–B of the positioning member. Generally distal portion 368 serves to locate dihedral reflector 364, which serves to reflect an energy beam from a dispersive element (not shown) mounted on the dispersive element mounting surface 328. Positioning member 304 is mounted to the base section via the slidable, cooperative, mating of first and second pairs of opposing planar surfaces 342A–B and 330A–B of respectively the positioning member and the base section. The positioning member is stabilized against the base section by the action of set screws passing through set screw holes 344A–B, and glue applied to the surface of either or both of the first and second pairs of planar surfaces. The center wavelength can be selected by adjusting the positioning member with respect to the base section, and then fastening one to another once a desired wavelength of light is emitted by the gain medium. Alternatively, locking screws could be used to fasten the planar surfaces. The actuator 366 is positioned between the motion section and the positioning member. In an embodiment of the invention the actuator is a piezoelectric device which elongates therefore increasing the separation between the motion section and the positioning member. When the piezoelectric actuator is de-energized the torsional members 362A–B serve to return the motion section to its original separation with respect to the positioning member, and consequently the dihedral mirror to its original position, with respect to the diffraction grating. Thus the wavelength of the zero-order reflection being emitted from the external cavity is adjusted due to the change in the length of the external cavity brought about by the movement of the dihedral mirror. In each of the embodiments shown the actuator is positioned in the propagation plane of the energy beam which traverses the external cavity from the gain medium, to the diffraction grating to the reflector and back. This is an advantageous feature of the embodiments in that no forces are generated during the movement of the motion section which tend to torque the dihedral about its longitudinal axis thereby causing displacement of the reflected beam outside the propagation plane. As will be obvious to those skilled in the art the actuator could, however be placed in other locations, outside the propagation plane.

Figure 4:
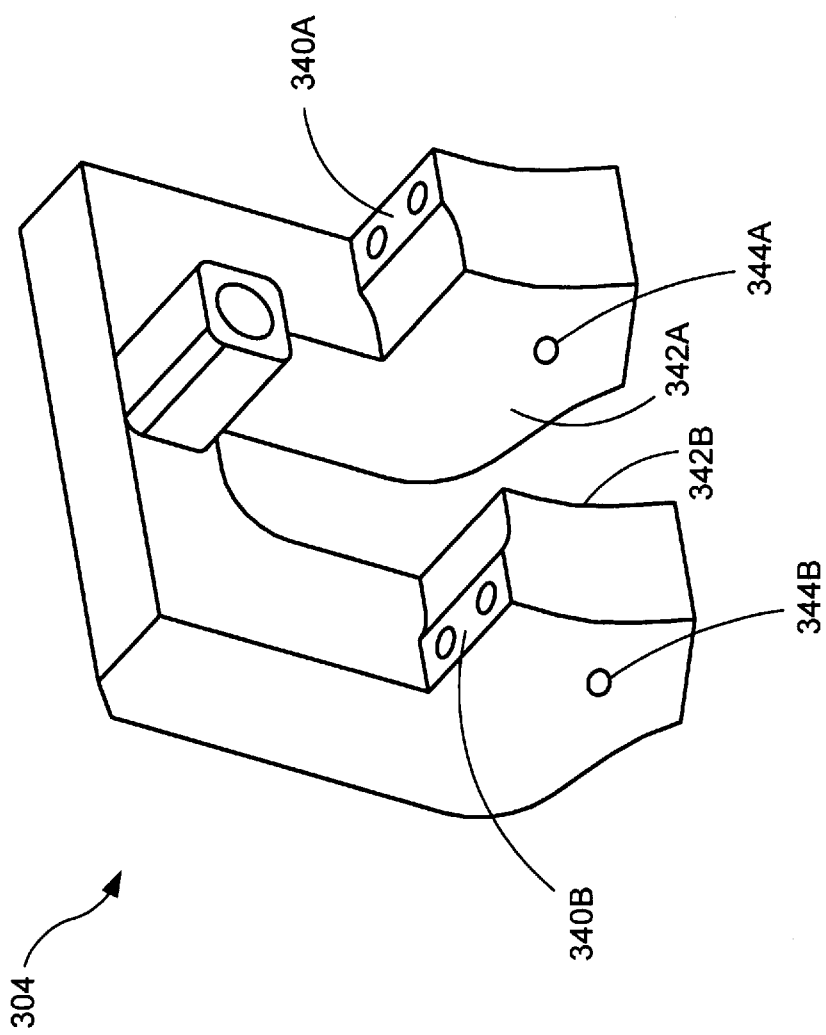
FIG. 4 shows a rear isometric view of the positioning member of the three-piece tunable external cavity laser shown in FIG. 3.

FIG. 4 shows a rear isometric view of the positioning member 304 of an external cavity laser housing according to the invention. The components, structure, and operation of the positioning member have been discussed above.

Figure 5:
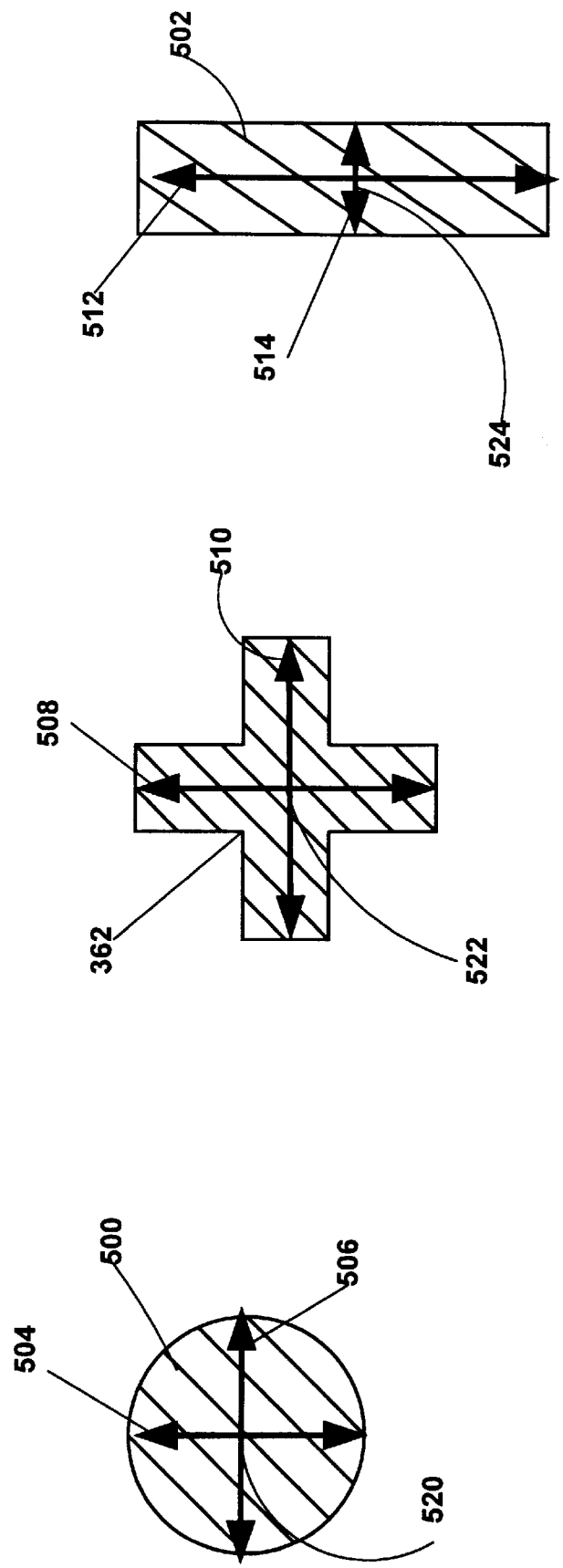
FIGS. 5A–C show cross-sectional views of alternate embodiments of the torsional member of the three-piece tunable external cavity laser shown in FIG. 3.

FIGS. 5A–C show cross sectional views of alternate embodiments of the torsional members of the motion section. Each of the embodiments exhibits different ratios of bending to torsional stiffness. FIG. 5A shows a torsional member 500 with a circular cross section. FIG. 5B shows the cross section at A—A of the torsional member 362 shown in FIG. 3 which is generally cross-shaped. FIG. 5C shows a torsional member 502 which is rectangular in cross section. The torsional member 500 with a circular cross section and a torsional axis 520 exhibits uniform bending stiffness about orthogonal axis 504–506. The cross-shaped cross-sectional member 362 with a torsional axis 522 exhibits improvement in the bending stiffness about both of orthogonal axis 508–510 due to the increase in moment of inertia about these axis. This design offers advantages when the primary deflection forces on the motion section, caused for example by the actuator, lie along one of or both of these axis. An additional advantage of the cross-sectional shape shown in FIG. 5B is that both torsional stiffness about axis 522 and bending stiffness can independently controlled. The torsional member shown in FIG. 5C with a torsional axis 524 exhibits improved bending stiffness about axis 512. These variations in cross-sectional design illustrate ways of varying the moments of inertia to improve bending stiffness about an axis and also to control torsional stiffness. The ability to vary the moments of inertia is important, for example, when using certain types of actuators, such as piezoelectric actuators. Piezoelectric actuators, which induce vibrations on the order of kilohertz, can add noise to the external cavity, and create distortions in the modulation of the laser beam, when they induce parasitic motions. It is possible to reduce this noise by varying the size and cross-sectional shape of the torsional portions, thus varying the moment of inertia preferentially along primary axis of deflection. In certain circumstances the matching of the preload of the motion member to the dynamic characteristics of the actuator may require a variation of the torsional properties of the torsional piece as well. Using the design methods discussed in connection with FIG. 5B the appropriate torsional stiffness for the actuator can be chosen while controlling the bending stiffness so as to reduce parasitic motion in the motion member, such as motions perpendicular to the axis of rotation.

Figure 6:
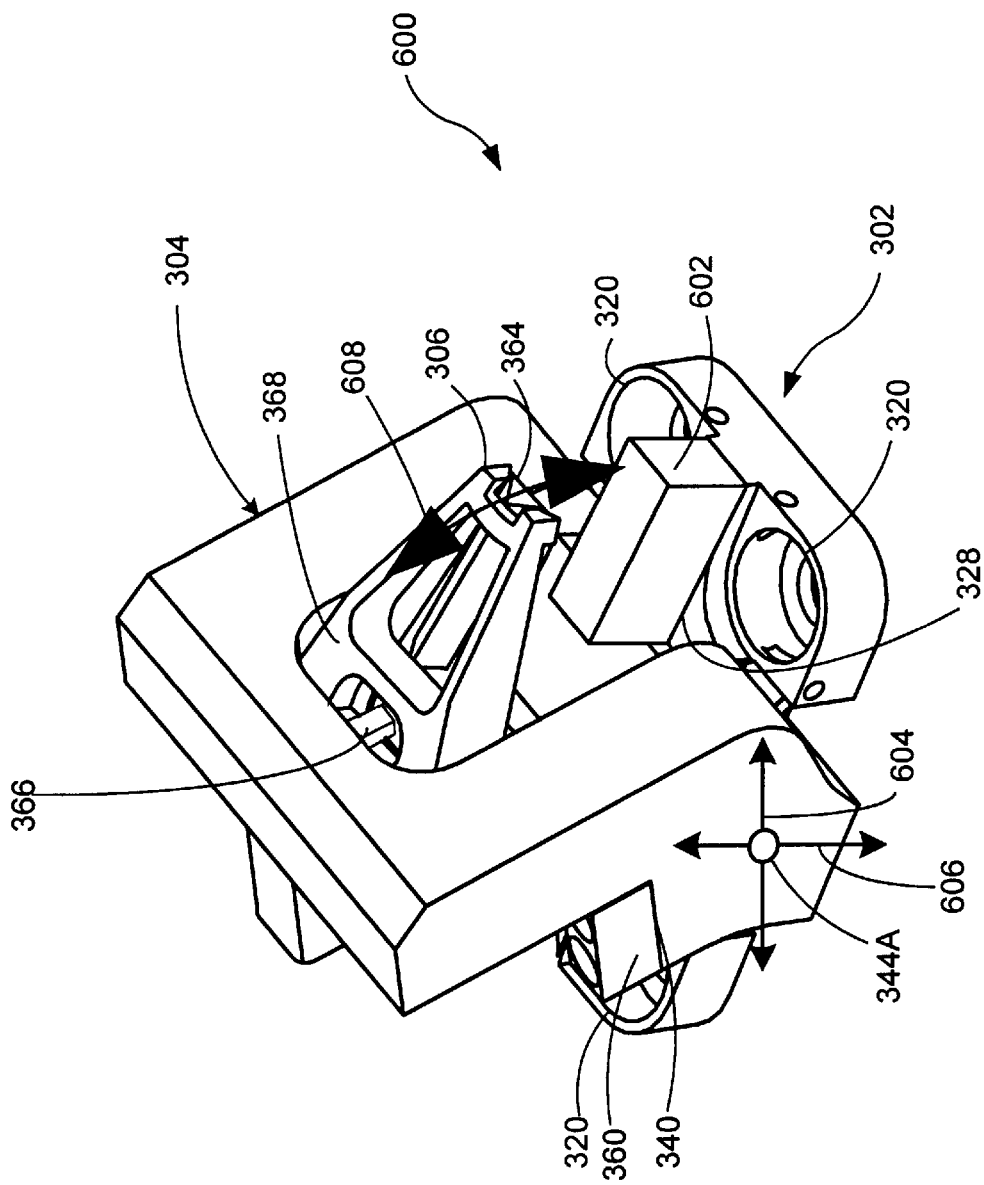
FIG. 6 shows a front isometric view of the assembled housing of the three-piece tunable external cavity laser shown in FIG. 3.

FIG. 6 shows a front isometric view of the assembled housing of the three-piece tunable external cavity laser shown in FIG. 3. The components, structure and function of the tunable external cavity diode laser shown in FIG. 6 are similar to those shown in FIG. 3, with the following differences. Shown in FIG. 6 is a dispersive element, e.g. diffraction grating 602, mounted on diffraction grating mounting surface 328. The diffraction grating serves to diffract a beam emitted from a gain medium (not shown), and operates cooperatively with dihedral reflector 364 to change the wavelength of the zero-order reflection from the tunable external cavity diode laser by changing the path length of the external cavity. Also shown is actuator 366, mounted between the motion section and the positioning member and abuts each of these. The actuator is selectively engageable to increase the distance between the distal end of the motion section and the positioning member, thereby affecting the distance between the dihedral reflector 364 and the diffraction grating 602. Another difference between FIG. 6 and FIG. 3 is that the various parts of the 3-piece embodiment of the inventive housing have been assembled. The motion section has been fastened to the positioning member. The positioning member 304 has been slidably positioned with respect to the base section 302, via the opposing first and second pairs of planar surfaces 330A-B and 344A-B of respectively the base and the positioning member. These surfaces allow relative movement between the two pieces in two dimensions as suggested by orthogonal arrows 604–606. The degree of freedom of the motion section movement is illustrated by arrow 608.

The various degrees of freedom of the motion section and positioning member permit precise selection of a center wavelength and a length for the external cavity. The user of the inventive housing can manipulate the location of the positioning member as desired, and then lock it into place with respect to the base section using glue and/or set screws. This coarse method of adjustment is inexpensive compared to the nanometer-scale tolerance bearings of the prior art, yet permits reasonably good precision in the selection of center wavelengths. Additional tuning is available by moving the motion section along arrow 608 with the actuator 366.

Figure 7:
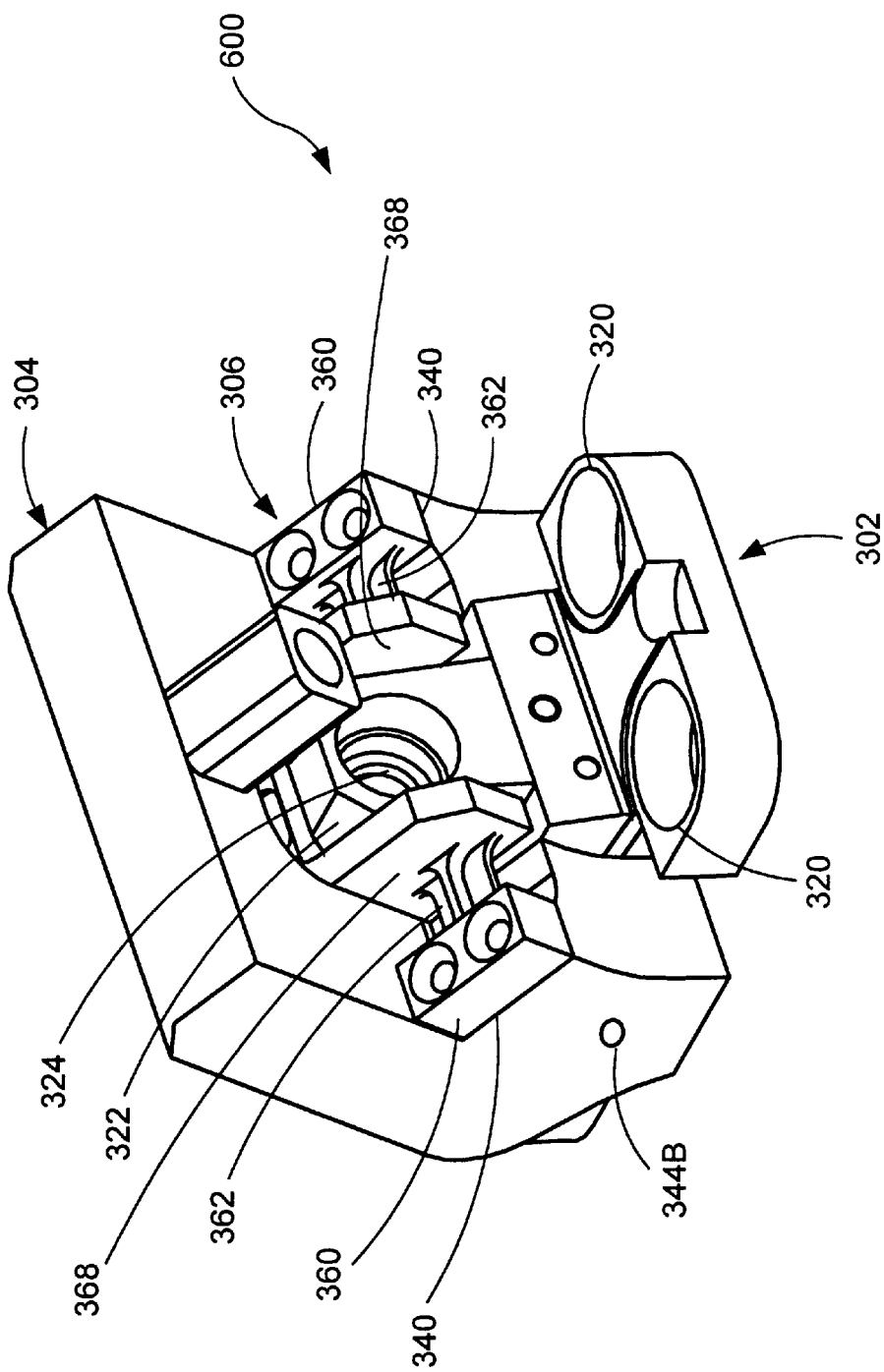
FIG. 7 shows a rear isometric view of the assembled housing of the three-piece tunable external cavity laser shown in FIG. 3.

FIG. 7 shows a rear isometric view of the three-piece embodiment of the tunable external cavity diode laser. The components, structure, and function of this tunable external cavity diode laser are the same as described above in FIGS. 3 and 6.

Figure 8:
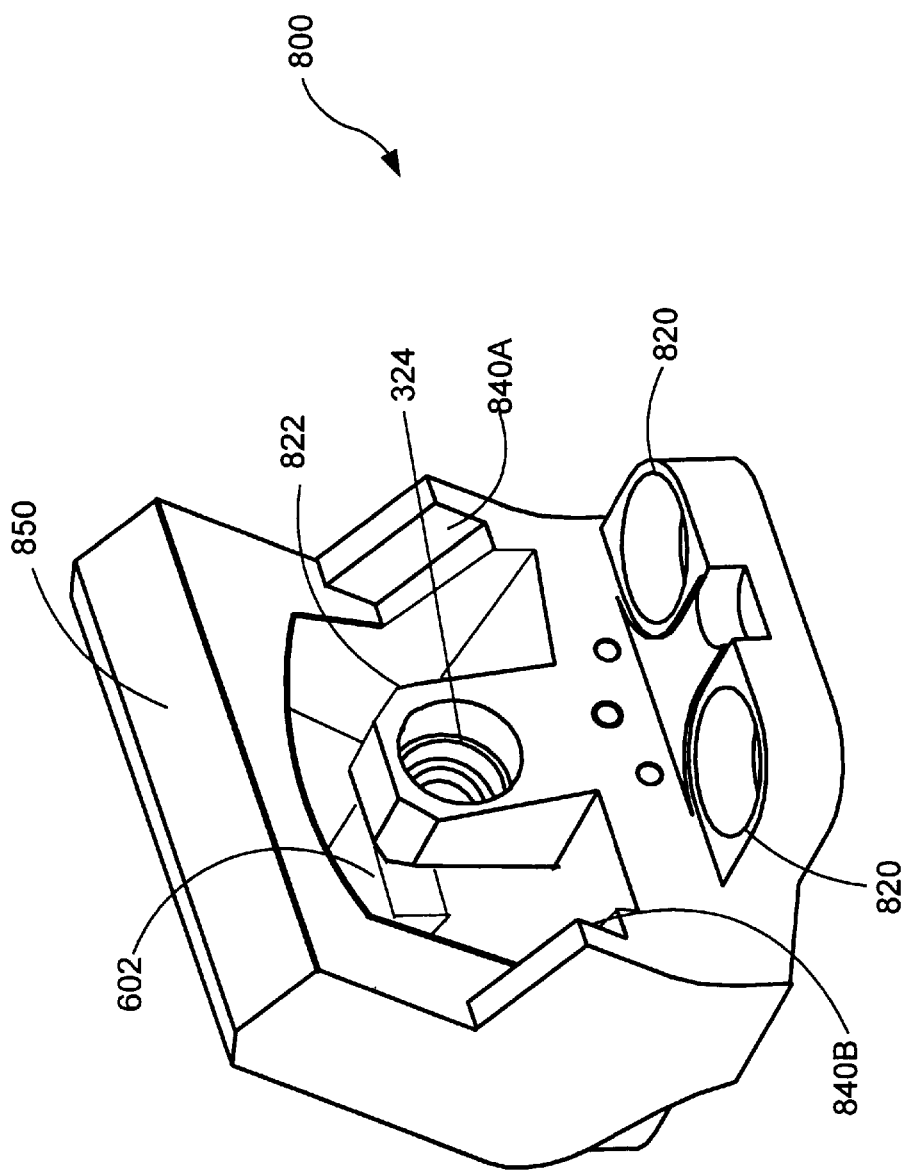
FIG. 8 shows a rear isometric view of the base section of a two-piece housing embodiment of the invention.

FIG. 8 shows a rear isometric view of a two-piece housing embodiment of a tunable external cavity diode laser according to the invention. While the three piece design offers significant flexibility in selecting the center wavelength and the cavity length, it may be appropriate in some circumstances to use a two-piece design. A two-piece design has fewer moving parts than the three-piece design, and therefore may be less expensive to manufacture. Additionally, there are fewer parts to position during assembly, which speeds final assembly of the housing and laser. Shown is base 800, which includes mounting holes 820, gain medium mount 822 for positioning a gain medium, e.g. laser 324, an opposing pair of planar positioning surfaces 840A-B, and an arch 850.

The mounting holes 820 pass through a lower portion of the base 800. The gain medium mount 822 and diffraction grating 602 are shown on an upper surface of the lower portion of the base in a relationship similar to that shown for the three-piece design of FIGS. 3 and 6. An arch 850 rises over the lower portion of the base and the gain medium mount. On a lower portion of the arch on opposing sides thereof a first pair of inward facing opposing planar positioning surfaces 840A-B are defined. It is against these surfaces that the motion section shown in FIG. 9 will be slidably positioned to select a center wavelength.

Figure 9:
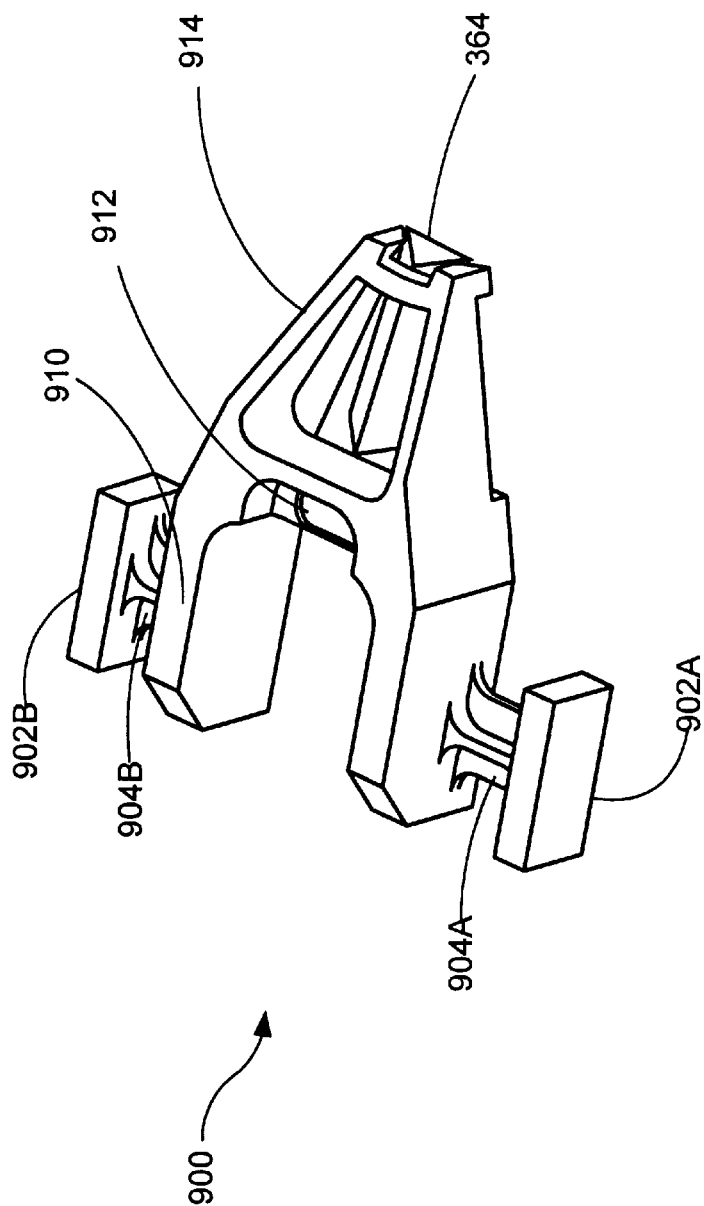
FIG. 9 shows a front isometric view of the motion section of the two-piece housing embodiment of the invention.

FIG. 9 shows motion section 900, which may be used in either a two-piece or a three-piece housing configuration. The motion section includes a proximal and distal end respectively 910 and 914. Torsional members 904A-B extend from opposite sides of the proximal end. At the terminus of each of the torsional portions positioning members 902A-B define a pair of outward facing opposing planar surfaces. At the distal end 914 a reflector, e.g. dihedral reflector 364 may be anchored. Intermediate the proximal and distal ends is defined an actuator pad 912 into which a piezoelectric actuator may be positioned.

Figure 10:
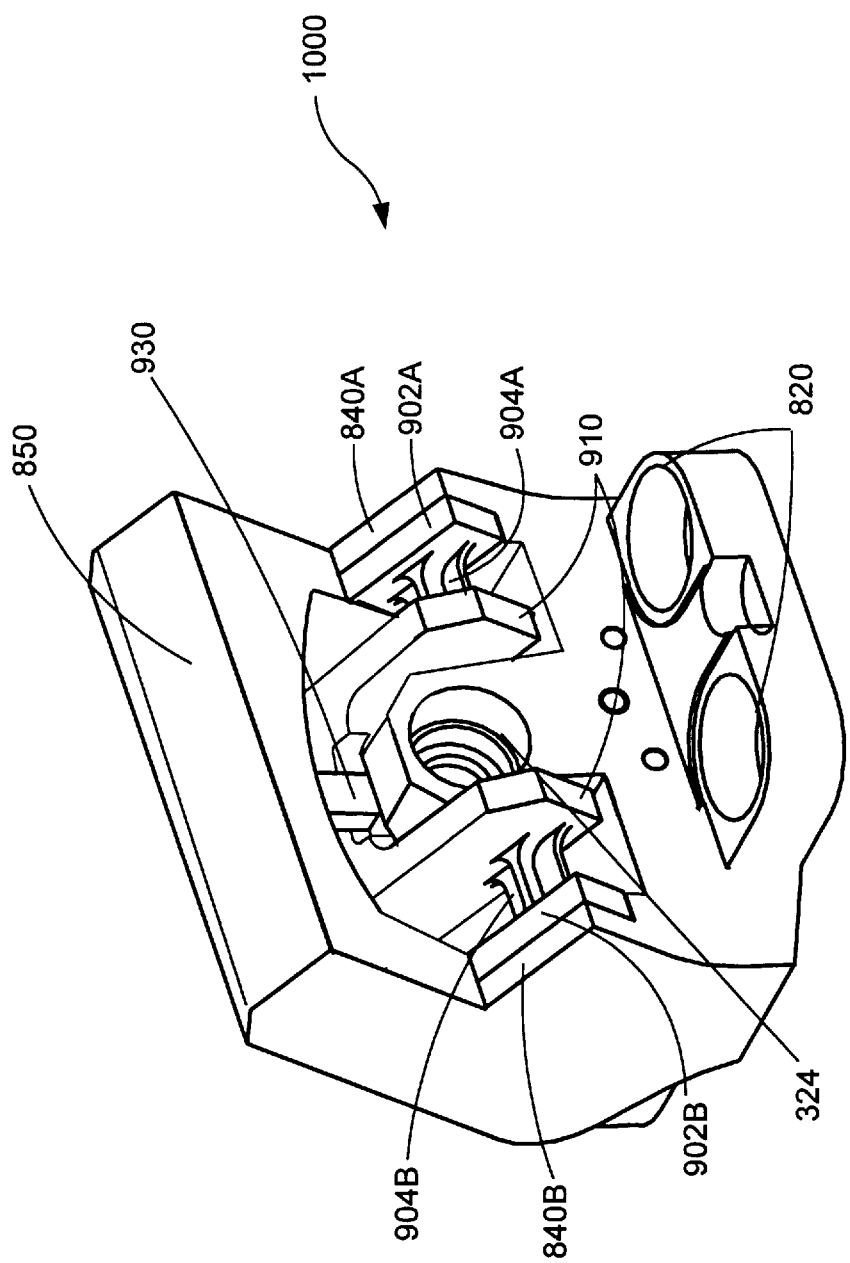
FIG. 10 shows a rear isometric view of an assembled, two-piece housing comprising the base and motion sections shown in FIGS. 8–9 respectively.

FIG. 10 shows a rear isometric view of an assembled, two-piece housing comprising the base and motion sections shown in FIGS. 8–9 respectively. The components, structure and operation of the tunable external cavity laser 1000 as shown in FIG. 10 are similar to the three-piece design described above in FIGS. 3–7, with the following exception. In FIG. 10 the cooperative action of the opposing pair of planar positioning surfaces 840A-B of the base and the opposing planar surfaces of positioning members 902A-B of the motion section allows slidable positioning of the motion section with respect to the base to select a center wavelength. Once a center wavelength is selected in this manner, the first and second pair of opposing planar positioning surfaces 840A-B are fixed with respect to one another by screws and/or epoxy, adhesive, or glue.

In operation, mounting holes 820 serve to fasten external cavity laser 1000 securely to a test surface. An actuator 930 positioned in the actuator pad 912 of the motion section and abutting the arch 850 selectively displaces the motion section away from the arch thereby changing the length of the external cavity formed between the gain medium, the diffraction grating and the dihedral reflector, to alter the wavelength of the zero-order reflection. The torsional members 904A-B provide return force to restore the motion section to its original position when the actuator is de-energized. As will be obvious to those skilled in the art the actuator may not only vary in type, as discussed above, but may also vary in location. For example, the actuator could be positioned below, behind, or beside the motion section rather than above it. There could be more than one actuator, e.g. an actuator placed on either side of the motion section. The actuator(s) could as discussed above, be positioned in the propagation plane formed by light emitted from the laser and the light.

In some circumstances, it may be appropriate to manufacture the inventive housing and lasers in a one-piece configuration. For example, the one-piece design has fewer moving parts than either the three-piece or two-piece designs, and therefore may less expensive to manufacture. However, the absence of the slidably cooperative "pivots" of the three-piece or two-piece embodiments does limit the amount of flexibility, i.e. degrees of freedom, in selecting center wavelengths or cavity lengths. This loss of flexibility can be offset by the use of actuator-driven cut-outs, that allow further positioning of the reflector and dispersive element with respect to the laser and other optical elements to select the center wavelength of the tunable external cavity laser.

Figure 11:
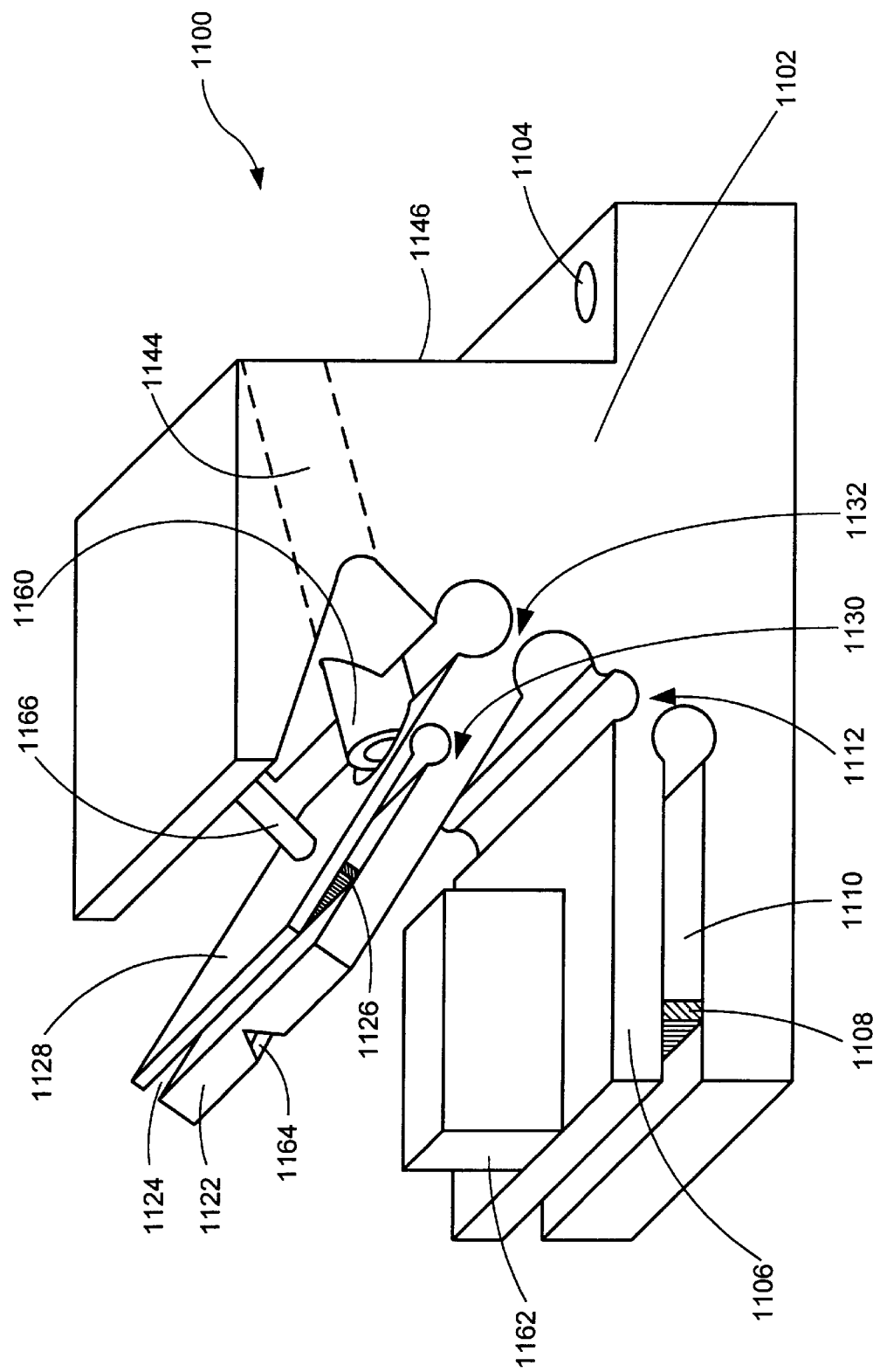
FIG. 11 shows a side isometric view of a one-piece embodiment of the housing for a tunable external cavity laser according to the invention.

FIG. 11 shows a side isometric view of a tunable external cavity diode laser 1100, in a one-piece configuration according to the invention. The housing includes base section 1102, mounting holes 1104, dispersive element pad 1106, first cut-out 1110, first positioner 1108, first torsional portion 1112, first and second distal motion sections respectively 1122, 1128, second cut-out 1124, second positioner 1126, second torsional portion 1130, third torsional member 1132, back section 1146 and laser mount opening 1144. To the housing are connected: a gain medium, e.g. laser 1160, a dispersive element, e.g. diffraction grating 1162, a reflector, e.g. dihedral mirror 1164, and actuator 1166.

Mounting holes 1104 pass through the base section 1102. Back section 1146 extends generally orthogonally from the proximal end of the base. Back section 1146 defines a gain medium mount opening 1144 oriented to direct the energy from a gain medium, e.g. laser 1160 at a diffraction grating 1162 mounted on the dispersive element pad 1106. The first positioner 1108 adjusts the orientation of the diffraction grating with respect to the base, by causing a torsional deflection about first torsional portion 1112 of the dispersive element pad 1106 with respect to the base section 1102. The dihedral mirror is mounted on the lower surface of the first distal motion section 1122. The second positioner 1126 adjusts the orientation of the dihedral mirror with respect to the base, by causing a torsional deflection about second torsional portion 1130 of the first distal motion section 1122 with respect to the second distal motion section 1128. As will be obvious to those skilled in the art first and second positioners may be active positioners such as piezoelectric actuators or passive positioners such as set screws. The settings of these positioners will allow the selection of a center wavelength for the tunable external cavity laser. The actuator is positioned between the second distal motion section 1128 and the back section 1146. The actuator is selectively energizable to torsionally deflect both the first and second distal motion sections 1122, 1128 about the third torsional member 1132 to vary the length of the external cavity and select the wavelength supported by gain medium, e.g. laser 1160. Thus, the wavelength of light emitted by the gain medium can be tuned, and the length of the external cavity adjusted, by positioning the dihedral mirror and the diffraction grating with respect to one another using the various actuators.

Figure 12:
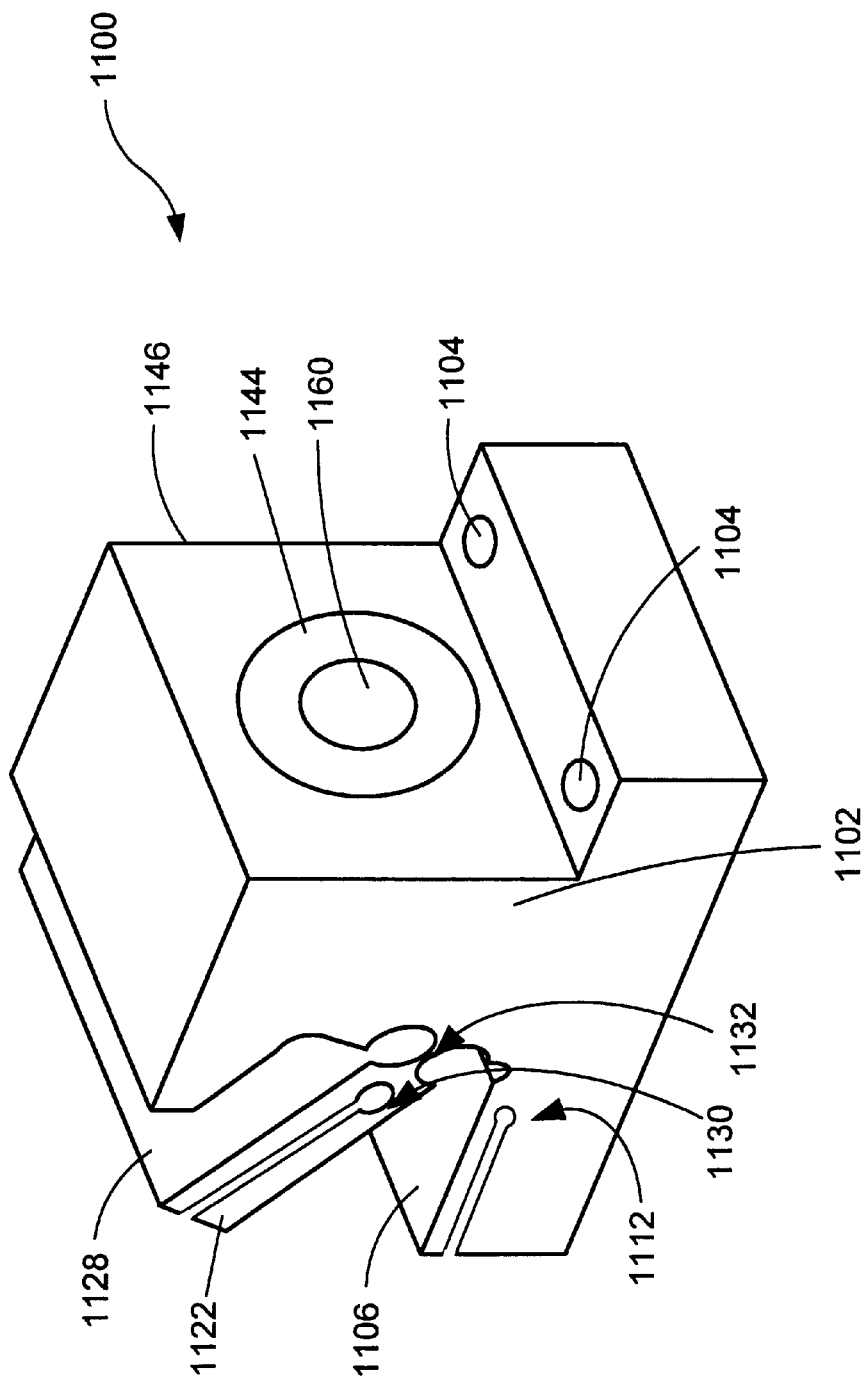
FIG. 12 shows a rear isometric view of the one-piece housing for a tunable external cavity laser shown in FIG. 11.

FIG. 12 shows a rear isometric view of the one-piece housing for a tunable external cavity laser shown in FIG. 11. The components, structure, and function of this tunable external cavity diode laser are the same as described above in FIG. 11.

It will be apparent to those skilled in the art that various modifications and variations can be made in the housing and lasers of the present invention without departing from the spirit or scope of the invention. Thus, it is intended that the present invention cover the modifications and variations of this invention provided they come within the scope of the appended claims and their equivalents.

What is claimed is:

1. A housing for a tunable external cavity laser wherein the tunable external cavity laser includes a gain medium, a reflector, and a dispersive element, and the housing comprising:

a base section including a proximal and distal portion, and the gain medium and the dispersive element mounted at respectively the proximal and distal portions such that a first energy beam emanating from the gain medium strikes the dispersive element leaving the dispersive element as a second beam at an angle with respect to the first beam which depends on wavelength;

a motion section including a proximal and a distal portion and a torsional member positioned at the proximal portion and the reflector positioned at the distal portion to reflect the second beam to the gain medium via the dispersive element, and the motion section supported by said base about the torsional member; and an actuator in selectively engagable abutment against said distal portion of said motion section to move the reflector with respect to the dispersive element about the torsional member to tune the external cavity laser.

2. The housing of claim 1, wherein the actuator moves the reflector with respect to the dispersive element in at least one of the following motions: arcuately, linearly and arcuately together with linearly.

3. The housing of claim 1, wherein the motion section further comprises a positioning member positioned at opposing ends of the torsional member and slidably positionable with respect to the base to position the torsional member to select a center wavelength for the external cavity laser.

4. The housing of claim 3, wherein the positioning member is formed integral with the opposing ends of the torsional member.

5. The housing of claim 3, wherein the positioning member is formed separate from the opposing ends of the torsional member and is fastened to the opposing ends.

6. The housing of claim 3, wherein the positioning member is fastened to the base at a selected slidable position by means of at least one of: an adhesive, a glue, a cement, a weld and a fastener; to fix a center wavelength for the external cavity laser.

7. The housing of claim 3, wherein the positioning member defines adhesive distribution channels, to increase a cross-section of at least one of: an adhesive, a glue and a cement used to fasten the torsional member to the base.

8. The housing of claim 3, wherein the base defines opposing planar surfaces to slidably mate with the positioning member.

9. The housing of claim 8, wherein the opposing planar surfaces of the base further define adhesive distribution channels, to increase a cross-section of at least one of: an adhesive, a glue and a cement used to fasten the torsional member to the base.

10. The housing of claim 1, wherein the motion section further defines a pair of positioning members positioned at opposing ends of the torsional member and slidably positionable with respect to the base to position the torsional member to select a center wavelength for the external cavity laser.

11. The housing of claim 10, wherein the pair of positioning members are formed integral with the opposing ends of the torsional member.

12. The housing of claim 10, wherein the pair of positioning members are formed separate from the opposing ends of the torsional member and are fastened to the opposing ends.

13. The housing of claim 10, wherein the pair of positioning members are fastened to the base at a selected slidable position by means of at least one of: an adhesive, a glue, a cement, a weld and a fastener; to fix a center wavelength for the external cavity laser.

14. The housing of claim 10, wherein the pair of positioning members defines adhesive distribution channels, to increase a cross-section of at least one of: an adhesive, a glue and a cement used to fasten the torsional member to the base.

15. The housing of claim 10, wherein the base defines opposing planar surfaces to slidably mate with the pair of positioning members.

16. The housing of claim 15, wherein the opposing planar surfaces of the base further define adhesive distribution channels, to increase a cross-section of at least one of: an adhesive, a glue and a cement used to fasten the torsional member to the base.

17. The housing of claim 1, wherein the distal portion of the motion section further comprises:

a first and a second distal motion sections each flexibly joined to the proximal portion of the motion section, and the reflector mounted to the second section, and a positioner to vary a separation between the first and the second distal motion sections to select a center wavelength of the external cavity laser.

18. The housing of claim 1, wherein the reflector comprises one of: a dihedral reflector, a cat's eye reflector, a corner cube and a mirror.

19. The housing of claim 1, wherein the dispersive element comprises a diffraction grating.

20. The housing of claim 1, wherein the actuator comprises at least one of: a piezoelectric actuator, an electrostrictive actuator, a magnetostrictive actuator, a screw, a micrometer, a solenoid, a bimetalic strip, and a thermal expansion member.

21. The housing of claim 1, wherein a cross section of the torsional member is at least one of: circular, rectangular and cross-shaped.

22. The housing of claim 1, wherein the torsional member includes an asymmetrical cross sectional distribution.

23. A tunable external cavity laser assembly comprising:

a gain medium;

a dispersive element;

a reflector;

a base section including a proximal and distal portion, and the gain medium and the dispersive element mounted at respectively the proximal and distal portions such that a first energy beam emanating from the gain medium strikes the dispersive element leaving the dispersive element as a second beam at an angle with respect to the first beam which depends on wavelength;

a motion section including a proximal and a distal portion and a torsional member positioned at the proximal portion and the reflector positioned at the distal portion to reflect the second beam to the gain medium via the dispersive element, and the motion section supported by said base about the torsional member; and an actuator in selectively engagable abutment against said distal portion of said motion section to move the reflector with respect to the dispersive element about the torsional member to tune the external cavity laser.

24. The tunable external cavity laser of claim 23, wherein the actuator moves the reflector with respect to the dispersive element in at least one of the following motions: arcuately, linearly and arcuately together with linearly.

25. The tunable external cavity laser of claim 23, wherein the motion section further comprises a positioning member positioned at opposing ends of the torsional member and slidably positionable with respect to the base to position the torsional member to select a center wavelength for the external cavity laser.

26. The tunable external cavity laser of claim 25, wherein the positioning member is formed integral with the opposing ends of the torsional member.

27. The tunable external cavity laser of claim 25, wherein the positioning member is formed separate from the opposing ends of the torsional member and is fastened to the opposing ends.

28. The tunable external cavity laser of claim 25, wherein the positioning member is fastened to the base at a selected slidable position by means of at least one of: an adhesive, a glue, a cement, a weld and a fastener; to fix a center wavelength for the external cavity laser.

29. The tunable external cavity laser of claim 25, wherein the positioning member defines adhesive distribution channels, to increase a cross-section of at least one of: an adhesive, a glue and a cement used to fasten the torsional member to the base.

30. The tunable external cavity laser of claim 25, wherein the base defines opposing planar surfaces to slidably mate with the positioning member.

31. The tunable external cavity laser of claim 30, wherein the opposing planar surfaces of the base further define adhesive distribution channels, to increase a cross-section of at least one of: an adhesive, a glue and a cement used to fasten the torsional member to the base.

32. The tunable external cavity laser of claim 23, wherein the motion section further defines a pair of positioning members positioned at opposing ends of the torsional member and slidably positionable with respect to the base to position the torsional member to select a center wavelength for the external cavity laser.

33. The tunable external cavity laser of claim 32, wherein the pair of positioning members are formed integral with the opposing ends of the torsional member.

34. The tunable external cavity laser of claim 32, wherein the pair of positioning members are formed separate from the opposing ends of the torsional member and are fastened to the opposing ends.

35. The tunable external cavity laser of claim 32, wherein the pair of positioning members are fastened to the base at a selected slidable position by means of at least one of: an adhesive, a glue, a cement, a weld and a fastener; to fix a center wavelength for the zero-order reflection.

36. The tunable external cavity laser of claim 32, wherein the pair of positioning members defines adhesive distribution channels, to increase a cross-section of at least one of: an adhesive, a glue and a cement used to fasten the torsional member to the base.

37. The tunable external cavity laser of claim 23, wherein the base defines opposing planar surfaces to slidably mate with the pair of positioning members.

38. The tunable external cavity laser of claim 37, wherein the opposing planar surfaces of the base further define adhesive distribution channels, to increase a cross-section of at least one of: an adhesive, a glue and a cement used to fasten the torsional member to the base.

39. The tunable external cavity laser of claim 23, wherein the distal portion of the motion section further comprises:

a first and a second distal motion sections each flexibly joined to the proximal portion of the motion section, and the reflector mounted to the second section, and a positioner to vary a separation between the first and the second distal motion sections to select a center wavelength of the external cavity laser.

40. The tunable external cavity laser of claim 23, wherein the reflector comprises one of: a dihedral reflector, a cat's eye reflector, a corner cube and a mirror.

41. The tunable external cavity laser of claim 23, wherein the dispersive element comprises a diffraction grating.

42. The tunable external cavity laser of claim 23, wherein the actuator comprises at least one of: a piezo electric actuator, an electrostrictive actuator, a magnetostrictive actuator, a screw, a micrometer, a solenoid, a bimetalic strip, and a thermal expansion member.

43. The tunable external cavity laser of claim 23, wherein a cross section of the torsional member is at least one of: circular, rectangular and cross-shaped.

44. The tunable external cavity laser of claim 23, wherein the torsional member includes an asymmetrical cross sectional distribution.

* * * * *